United States Patent [19]

Shusterman et al.

[11] Patent Number: 5,321,373
[45] Date of Patent: Jun. 14, 1994

[54] COMBINED DIFFERENTIAL-MODE COMMON-MODE NOISE FILTER

[75] Inventors: Boris I. Shusterman, Brookline; Robert Curtis, Hudson, both of Mass.

[73] Assignee: Digital Equipment Corporation, Maynard, Mass.

[21] Appl. No.: 87,541

[22] Filed: Jul. 2, 1993

Related U.S. Application Data

[62] Division of Ser. No. 863,578, Apr. 3, 1992, Pat. No. 5,243,308.

[51] Int. Cl.$^5$ .......................... H04B 3/08; H01F 17/06
[52] U.S. Cl. ........................................ 333/12; 333/181; 333/185; 336/175; 439/607
[58] Field of Search .................... 333/181–185, 333/12; 336/174, 175, 233; 430/607, 620

[56] References Cited

U.S. PATENT DOCUMENTS

| | | |
|---|---|---|
| 4,636,752 | 1/1987 | Saito ........................ 333/12 |
| 4,656,451 | 4/1987 | Pomponio ................. 336/96 |
| 4,751,479 | 6/1988 | Parr .......................... 333/12 |
| 4,761,147 | 8/1988 | Gauthier ................ 439/620 X |
| 4,964,012 | 10/1990 | Kitagawa ................. 361/113 |
| 5,083,101 | 1/1992 | Frederick ............... 333/12 X |
| 5,119,059 | 6/1992 | Covi et al. .............. 336/175 |
| 5,138,287 | 8/1992 | Domokos et al. ......... 333/12 |

FOREIGN PATENT DOCUMENTS

0081321  5/1983  Japan .................. 333/181

Primary Examiner—Seungsook Ham
Attorney, Agent, or Firm—Albert P. Cefalo; Dirk Brinkman

[57] ABSTRACT

An electromagnetic noise filter has a plurality of U-shaped wires passing through a ferrite core. Some of the wires are singly fitted in throughholes, whereas other wires are commonly fitted in throughholes. The wires can be interconnected to provide for impedance to both differential-mode and common-mode noise.

6 Claims, 9 Drawing Sheets

COMBINED DIFFERENTIAL-MODE COMMON-MODE NOISE FILTER

This is a divisional of copending application(s) Ser. No. 07/863,578 filed on Apr. 3, 1992 (U.S. Pat. No. 5,243,308)".

FIELD OF THE INVENTION

This invention relates to reducing electromagnetic interference, and more particularly to a noise filter for signal transmission paths.

BACKGROUND OF THE INVENTION

Electronic devices may experience serious operating difficulties when subjected to unintended electromagnetic noise. Such electromagnetic noise, which interferes with the normal operation of the devices, is generally known as EMI. In order to ensure the reliable operation of electronic devices it is desirable that EMI be reduced to a minimum.

The manner in which electromagnetic interference is suppressed is dependent on the nature of the interference. There are two ways undesirable noise can propagate in signal transmission paths: one is differential-mode interference, and the other is common-mode interference.

Differential-mode interference causes the potential of one side of a signal transmission path to be changed with respect to another side. With this type of interference, the interference current path is wholly in the signal transmission path.

Common-mode interference appears between two signal transmission paths and a common reference plane (ground), and causes the potential of both sides of the transmission path to be changed simultaneously and by the same amount relative to the reference plane. Common-mode noise may be caused by an electric (capacitive) or magnetic (inductive) field when interference is induced in both signal transmission paths equally. The noise voltage that is developed is the same in both transmission paths.

Through a process known as common-mode conversion, common-mode noise currents can be converted to differential-mode voltages due to the inherent impedance and capacitance characteristics of the signal transmission paths and the reference plane.

It is well known that noise in signal transmission paths can be reduced by surrounding the electrical conductors of the signal transmission path with a substance capable of absorbing undesired harmonics. Ferrite materials can be used for this purpose.

A typical prior art differential filtering component is constructed as a magnetic core having one or more separately imbedded conductors. However, it is well known that at certain field strengths the core becomes saturated, its permeability reduced, thereby limiting the ability of the core to produce high impedance to undesired noise. When there are more than one conductors imbedded in the same ferrite structure each works as an individual differential inductor with limited mutual coupling. Most of the magnetic flux lines related to the field around one of the conductors will close without encircling other conductors, and any mutual inductance is only due to stray fields. In such a configuration the equivalent circuit consists of differential inductors and common-mode inductors of relatively much smaller value. Such an arrangement results in poor mutual coupling and the structure is suitable mainly for low power differential-mode noise attenuation applications.

In other prior art arrangements, the ferrite core is configured as, for example, an annular ring, with a commonly shared air space for several conductors. The conductors may be wrapped around the core several times in an interleaved fashion to increase mutual coupling. Although such an arrangement may provide high common-mode inductance, this type of core and winding can not be used in circuits requiring high differential inductance. Only leakage inductance, contributed by that part of the magnetic flux not coupled into the other side, produces some differential attenuation. However, this reduces the common-mode effect of the part and forces the designer to compromise on performance. In other words, typical prior art noise filters are generally designed to be effective in applications requiring either a differential-mode inductor or a common-mode inductor, but not both.

Therefore, it is desirable to provide an apparatus which is capable of common-mode noise rejection for pairs of wires carrying differential signals as well as capable of filtering differential-mode noise by in-line inductance.

SUMMARY OF THE INVENTION

In accordance with one embodiment of the present invention the noise filter comprises a magnetic core with a first pair of throughholes having a U-shaped electrically conductive wire fitted therein and a second pair of throughholes having a plurality of U-shaped electrically conductive wires fitted therein. Each of the U-shaped wires has ends protruding outside the core for connecting to electrical circuits having signal transmission paths carrying signals requiring filtering of differential-mode or common-mode interference.

In accordance with another embodiment of the invention, the noise filter comprises a magnetic core with a well formed therein and a plurality of throughholes formed in the bottom of the well of the core. The well and the plurality of throughholes are configured for receiving electrically conductive wires having ends protruding outside the core for connecting to electrical circuits carrying signals requiring filtering of differential-mode or common-mode interference.

According to the present invention there is provided an electrical noise filter which can attenuate either differential or common-mode electromagnetic interference, or both. According to another aspect of the invention, the noise filter is provided as a single component which can easily be mounted on a printed circuit board or electrical signal cable.

These and other features and advantages of the present invention will become apparent from a reading of the detailed description in conjunction with the attached drawings in which like reference numerals refer to like elements in the several views.

DETAILED DESCRIPTION

Figure 1:
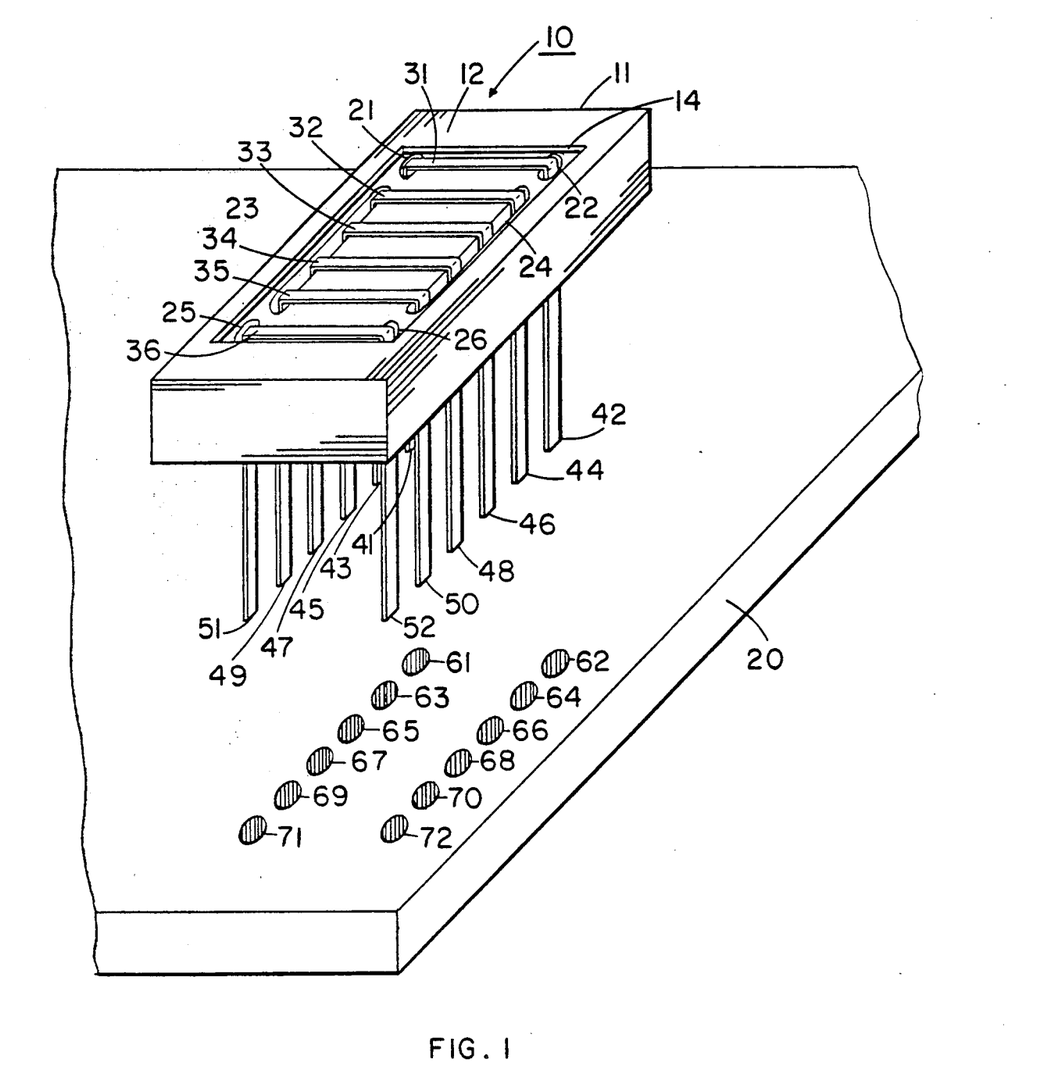
FIG. 1 is a perspective view of a noise filter according to one embodiment of the present invention.

Now, with reference to the drawings, in FIG. 1 there is shown a combined common-mode and differential-mode noise filter 10, according to one embodiment of the invention for providing impedance to electromagnetic interference ("EMI") currents flowing in signal transmission paths of electrical circuits.

The filter 10 comprises a generally rectangular core 11 of a magnetic material having a plurality of pairs of throughholes 21-22, 23-24, and 25-26. A plurality of generally U-shaped electrical conductors or wires 31, 32-35, and 36 having terminal ends 41-52 at the opposite ends thereof are fitted in the throughholes 21-22, 23-24, and 25-26 respectively, for providing signal transmission paths.

As shown in FIG. 1, the filter 10 is configured, by way of example, to be compatible with automated insertion systems that are typically used for mounting electronic components on a substrate, for example, printed circuit board 20. That is, the core 11 has external dimensions that are similar to the dimensions of commonly used electronic components, such as integrated circuits. To improve handling of the filter 10 by the insertion system and to reduce the likelihood of accidental short circuits, the top face 12 of the core 11 is formed with a recess 14 for receiving the top portions of wires 31-36. That is, the wires 31-36 fitted in the core 11 do not protrude above the plane of the top face 12 of the core 11. The terminal ends 41-52 of the wires 31-36 are spaced apart, for example, similarly to the spacing commonly used for integrated circuit pins.

Regarding the magnetic material of the core 11, different types of ferrite can be used. The material chosen can be selected to be most effective for a particular range of problem frequencies. It is possible to combine different materials to obtain specific attenuation characteristics with such a composite core. Tin, or nickel plated bare wires 31-36 can safely be used if the ferrite material is of high resistivity type, alleviating the need to insulate the wires 31-36 from the core 11. If low resistivity ferrite material is used the wires 31-36 may be insulated or put through the core 11 with appropriate spacers or bushings to avoid direct contact with the core 11.

Some of the pairs throughholes, for example 21-22 and 25-26, are shaped to receive single wires 31 and 36, respectively. The pair of throughholes 24-25 are made larger, for example elongated, to receive a plurality of wires, such as the four wires 32, 33, 34 and 35. The terminal ends 41-52 are suited for insertion in throughholes or vias 61-72 respectively, of the printed circuit board 20. Alternatively, the wire ends 41-52 may be bent over at right angles to be compatible with surface mounting techniques. The vias 61-72 are typically connected to electronic circuits of the PCB 20, not shown, including signal sources and signal receivers or loads.

During operation of the filter 10, the wires 32-35, which are fitted in the elongated throughholes 23-24 and which share a common air space become as a whole a mutually coupled inductor for impeding common-mode noise. The wires 31 and 36, which are individually fitted in throughholes 21-22 and 25-26 respectively and do not share any common air space with any other wires, provide for a differential in-line inductor to attenuate differential-mode noise. Thus, the filter 10 according to the invention combines in a single core 11 the functions of both a differential-mode filter and a common-mode filter.

A multitude of different noise filtering circuit configurations can be achieved with the filter 10 by connecting the various wires 31-36 to: for example, electronic circuits of the printed circuit board 20; other commonly used filtering components such as capacitors; and to one and another. By way of example, the wires 31-36 can be connected in series, in parallel, or the like.

Figure 2:
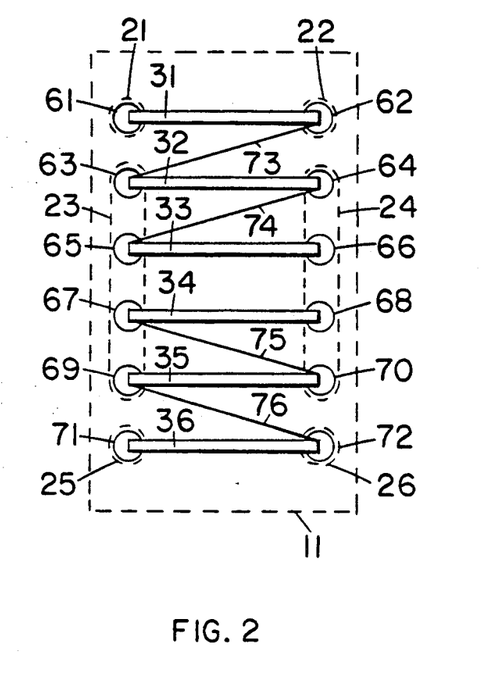
FIG. 2 is a top plan view wiring diagram for the noise filter of FIG. 1.
Figure 3:
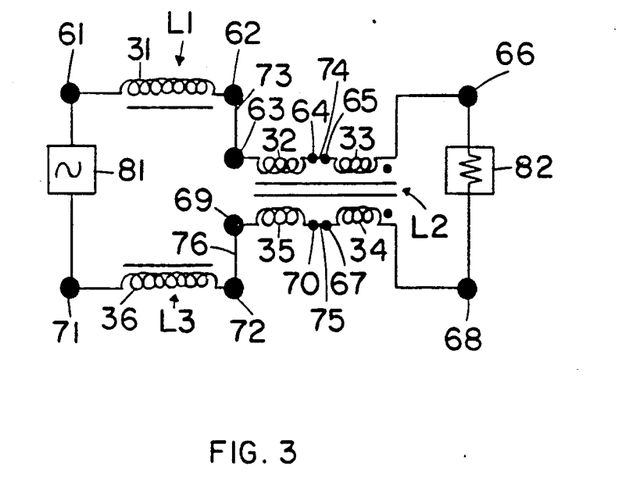
FIG. 3 is a schematic of a circuit arrangement using the noise filter of FIG. 1 and the wiring of FIG. 2.

Referring now to FIGS. 2 and 3 one such a circuit configuration is shown by way of example to provide both differential-mode and common-mode noise attenuation for a pair of signal transmission paths carrying differential signals. In this exemplary circuit, the vias 62 and 63, 64 and 65, 67 and 70, and 69 and 70 are connected to each other by lines 73, 74, 75, and 76, respectively. The lines 73-76 are formed on the printed circuit board 20 by conventional means, such as etched conductive traces. A signal source 81 for a differential signals is connected to vias 61 and 71. A receiver or load 82 for the differential signals is connected to vias 66 and 68.

In operation, the wires 31 and 36 individually fitted in the throughholes 21-22 and 25-26 act as differential in-line inductors L1 and L3 respectively. The wires 32-35 commonly fitted in throughholes 23-24, act as a two turn mutually coupled inductor L2. Thus, the circuit of FIG. 3 provides for differential-mode and common-mode filtering of the differential signals transmitted from the source 81 to the receiver 82 by using a single component filter 11. The mutual coupling of the common-mode coil L2 can be further improved, for example, by alternatively interleaving the wires, so that wires 31, 32 and 34 are connected to one side of the differential signal source 81 and wires 36, 35, and 33 are connected to the other side. It should also be apparent to one skilled in the art that a similar circuit, albeit at a lower inductance, can be achieved by having only two wires, one for each side of the differential signal, in the elongated holes 23-24.

Figure 4:
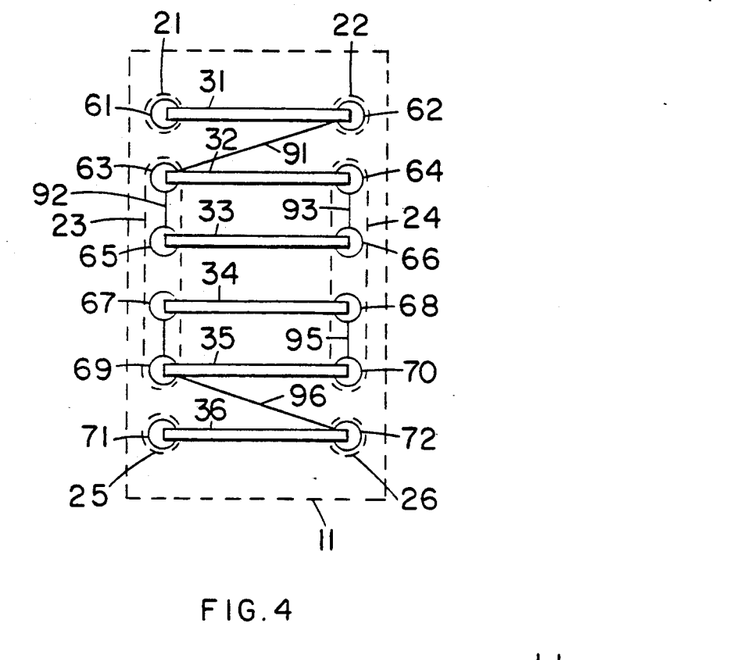
FIG. 4 is a top plan view wiring diagram for the noise filter of FIG. 1.
Figure 5:
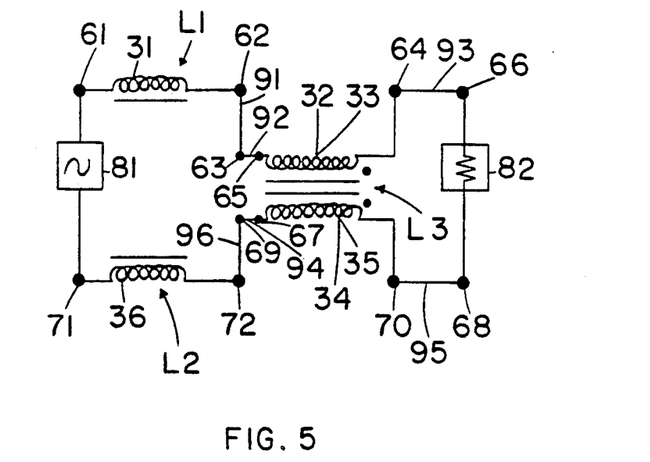
FIG. 5 is a schematic of a circuit arrangement using the noise filter of FIG. 1 and the wiring of FIG. 4.

An alternative circuit configuration is shown in FIGS. 4 and 5. In this circuit, the vias 42 and 63, 63 and 65, 64 and 66, 67 and 69, 68 and 70, and 69 and 72 are connected to each other by lines 91, 92, 93, 94, 94, and 96 respectively. Therefore, in this configuration the wires 32-33 and 34-35 are each connected in parallel for higher current capacities.

When arranged in the circuit configurations as shown in FIGS. 3 and 5 the filter 10 can provide absorptive filtering for EMI between 10 KHz and 500 MHz and give an attenuation of between 20 dB and 60 dB for currents as high as 10 amperes.

Figure 6:
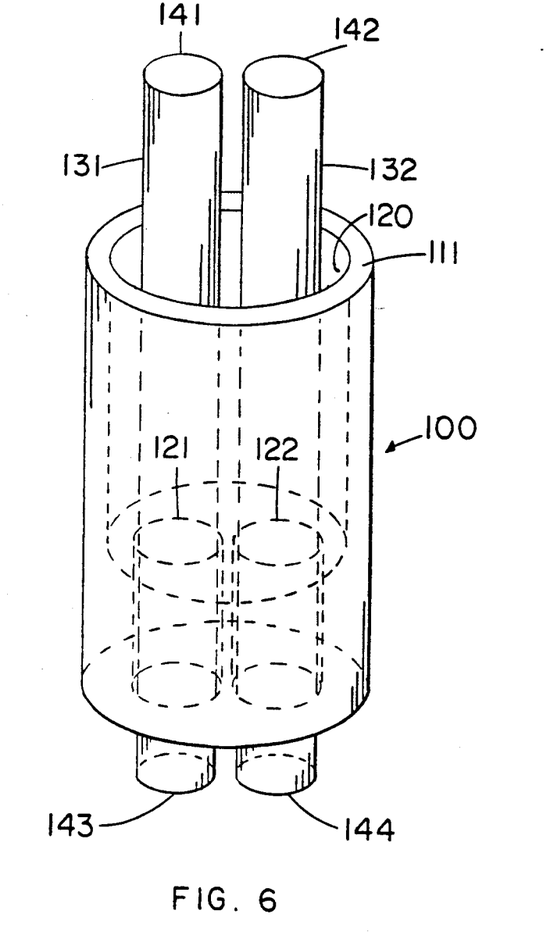
FIG. 6 is a perspective view of a noise filter according to another embodiment of the present invention.

An alternative embodiment of a combined differential-mode and common-mode filter is shown in FIG. 6. The filter 100 comprises a generally cylindrical core 111 of a ferrite material, preferably of high resistivity to be able to use bare wires, for example a plastic-ferrite compound, having a generally circular cavity 120 formed therein. A plurality of throughholes, for example two throughholes 121 and 122, are formed in the bottom of the cavity 120. A plurality of electrically conductive wires, for example wires 131 and 132, having terminal ends 141-143 and 142-144 respectively at the opposite ends thereof, are partially fitted commonly in the cavity 120, and separately in the throughholes 121 and 122.

Figure 7:
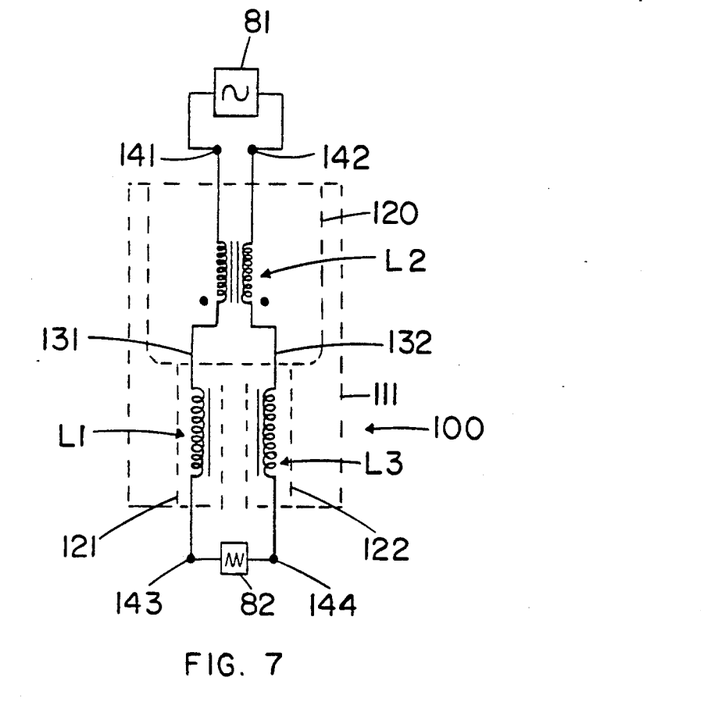
FIG. 7 is a schematic of a circuit arrangement using the noise filter of FIG. 1 and wiring of FIG. 4.

During operation of the filter 100, as is shown in FIG. 7, the wires 131 and 132 are connected to the source 81 of a differential signal and to the receiver or load 82. The portions of the wires 131-132 passing through the cavity 120 share a common air space and therefore provide for a mutually coupled inductor L2. The portions of the wires 131-132 passing separately through the throughholes 121 and 122 provide for differential in-line inductors L1 and L2 respectively. Thus the filter 100, according to this embodiment of the present invention, attenuates with a single component filter 100 both differential-mode and common-mode noise in the signals carried by the wires 131 and 132.

It will be appreciated that the filters 10 and 100 need not be of a particular shape. The cores 11 and 111 can be shaped differently to fit compactly into available space. It should also be appreciated that the throughholes 21-26 and 121-122 are selected to accommodate the wires 31-36 and 131-132 fitted therein and could be of different shape according to the nature and number of the wires.

Figure 8:
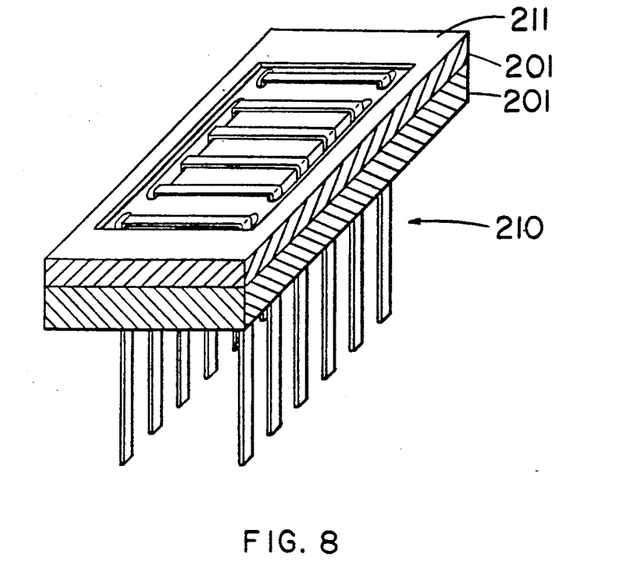
FIG. 8 shows an alternative to the filter shown in FIG. 1.
Figure 9:
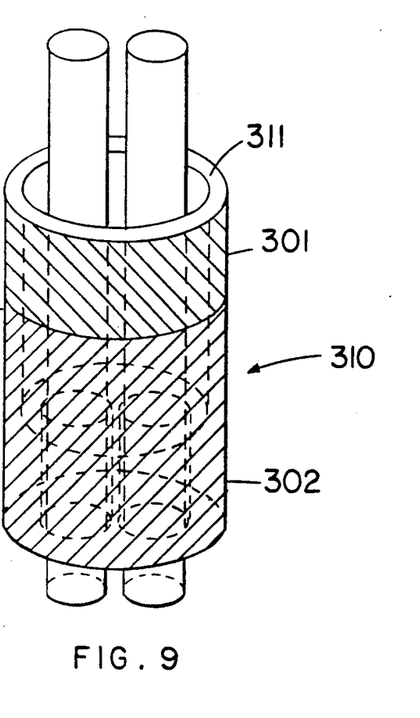
FIG. 9 shows an alternative to the filter shown in FIG. 6.

It is also possible to adapt filters 10 and 100 to filter interference of different frequency ranges by a suitable choice of inductive and absorptive materials, for example powder iron or MPP. These materials are produced with inherent air gaps resulting in the ability to store inductive energy. The suggested structures can be implemented to produce inductors for low power DC converters applications. Furthermore, the effective frequency range can be extended by combining materials having different frequency and impedance characteristics. For example, as shown in FIG. 8 and 9, the filters 210 and 310 having cores 211 and 311 respectively, are each made up of, for example, two separate core pieces 201-202 and 301-302 respectively, stacked one on top of the other. The pieces 201, 301 are made of a ferrite material which has different frequency and impedance characteristics than the material used for the pieces 202 and 302. Thus the combined impedance of the cores 211 and 311 is extended. A material with good impedance at low frequencies, for example up to 5 MHz, is a manganese-zinc ferrite compound. To effectively attenuate noise at higher frequencies a nickel-zinc ferrite compound can be used.

Figure 10:
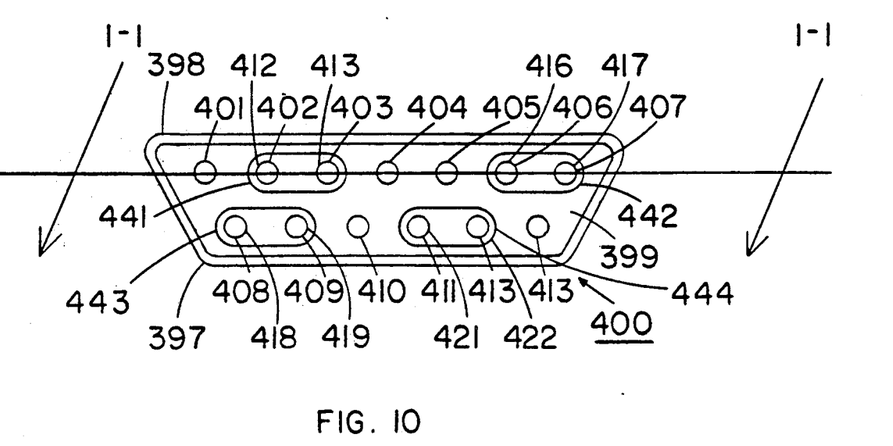
FIG. 10 is a top plan view of a noise filter according to a further embodiment of the present invention.
Figure 11:
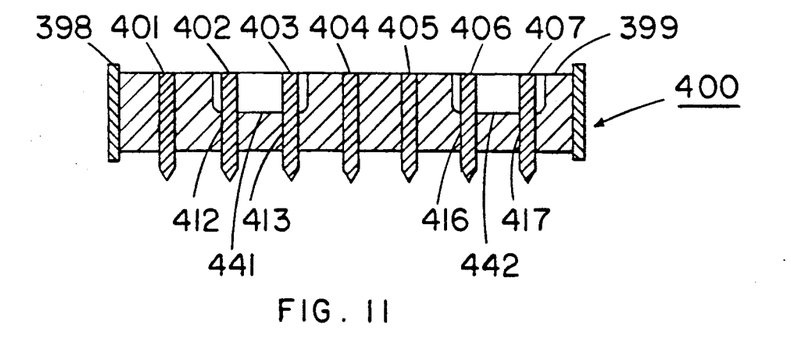
FIG. 11 is a cross-section of the noise filter of FIG. 10 along line 1—1 of FIG. 10.

In an another embodiment of the invention, as shown in FIGS. 10 and 11, the filter 400 has a core or "plate" 399 shaped to fit inside an industry standard communication cable connector 397, for example a 13 pin RS422 connector such as is typically used for serial data communications, having a housing 398. Since this type of communication requires balanced (differential) transmission mode the ferrite plate 399 can be fixed in the connector 397 to provide differential and common-mode attenuation for balanced pairs of signal transmission paths. This would further improve the performance of the transmission circuit by providing a better signal to noise ratio. In the case of single-ended communication lines, such as RS232, the ferrite plate 399 may be put in the connector 397 to provide differential-mode attenuation. In many other cases, where wires from the same signal transmission path pairs are located adjacent to each other, partial removal of the ferrite material between the adjacent pairs of wires results in higher common-mode attenuation of the conducted noise, while other wires benefit from differential noise attenuation by being surrounded by ferrite material. By way of example, in the connector 397 some of the pins, for example the pairs of pins 402-403, 406-407, 408-409 and 411-412 carry differential signals, whereas other pins, for example pins 401, 404, 405, 410, and 413 do not. Therefore, according to the invention, the throughholes 412-413, 416-417, 418-419, and 421-422 are partially elongated to provide common air cavities 441, 442, 443, and 444 respectively for the wires fitted therein. Thus the RS422 (or RS232) connector 397 is provided with a noise filter 399 which impedes both differential-mode and common-mode noise in signal transmission paths passing there-through.

Figure 12:
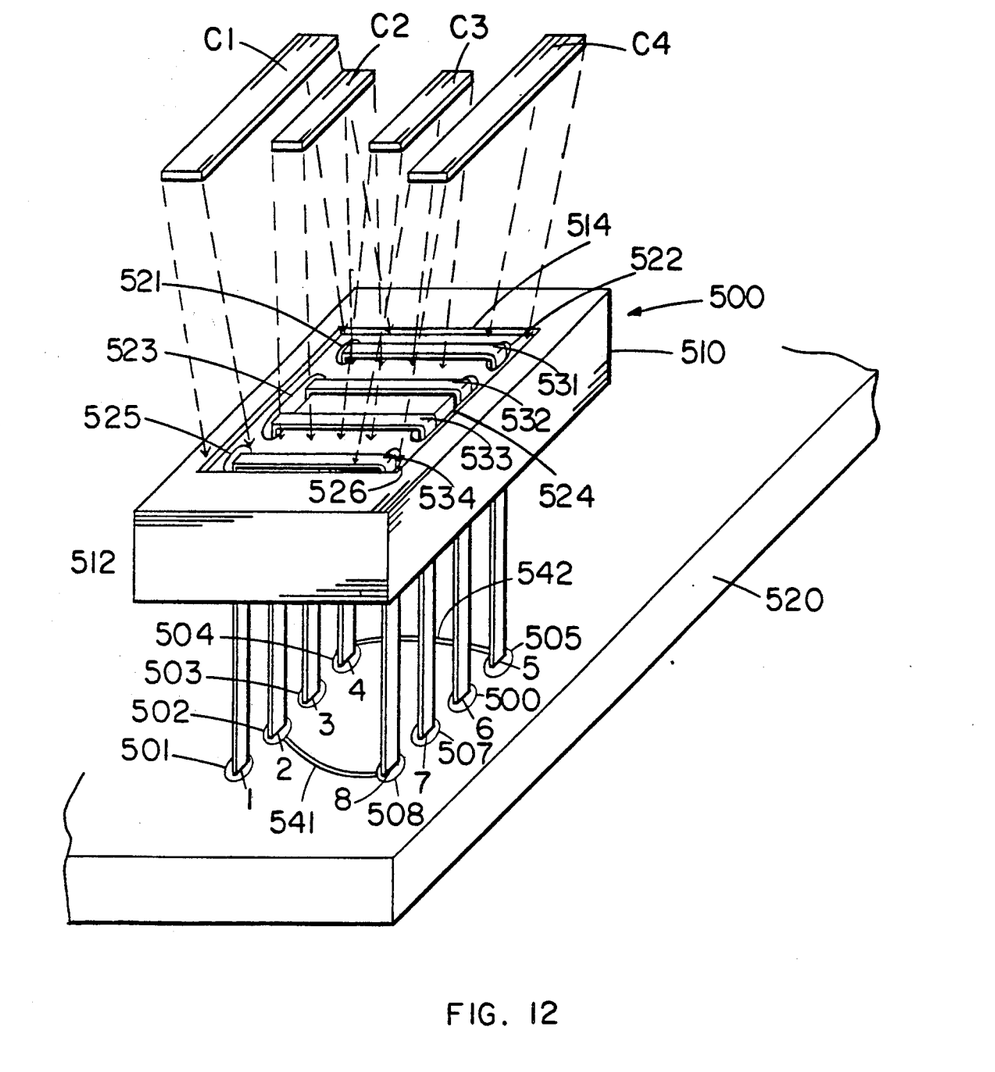
FIG. 12 is a perspective view of a LC filter, partially assembled, according to another embodiment of the invention.
Figure 13:
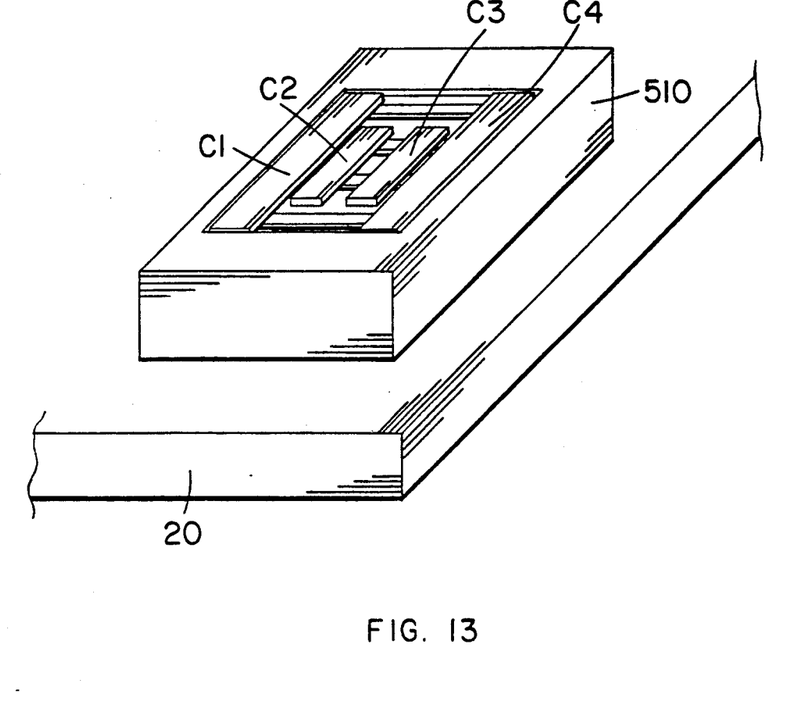
FIG. 13 is a view of the filter of FIG. 12 assembled.
Figure 14:
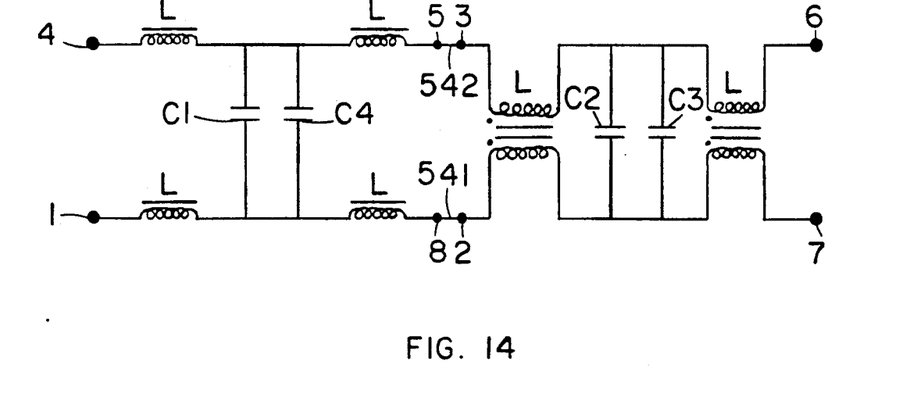
FIG. 14 is a schematic of a LC filter circuit using the assembly of FIG. 12.

In yet another embodiment of the invention, a low pass compact LC filter can be created. As shown in FIGS. 12 and 13, the filter 500 comprises a generally rectangular core 510 of a magnetic material having a plurality of pairs of throughholes 521-522, 523-524, and 525-526 and a rectangular recess 514 formed in the top face 512. A plurality of generally U-shaped electrical conductors 531, 532, 533, and 534 having terminal ends 1-8, 2-7, 3-6, and 4-5 respectively, are fitted in the throughholes 521-526 similarly to the configuration of FIG. 1. Mounted on the top portion of the wires are, for example, four decoupling capacitors, C1, C2, C3, and C4, arranged as follows, and as shown schematically in FIG. 14. Two of the capacitors, C1 and C4, are connected in parallel between the wires 531 and 534 which are fitted separately in throughholes 521-522 and 525-526 respectively, that is, the in-line differential inductors. The other two capacitors, C2 and C3, are connected in parallel between the wires 532 and 533 which are fitted in the elongated throughholes 522-523, that is, the mutually coupled inductors. The LC filter circuit can be completed by connecting wire end 8 to wire end 2, and connecting wire end 5 to wire end 3. By way of example, the filter 500 can be inserted in the vias 501-508 of a printed circuit board 520. Vias 502 and 508, and vias 503 and 505 can be connected to each other by conventional circuit lines 541 and 542 respectively.

The capacitors C1-C4 can be conventional "miniature" surface mountable ceramic capacitors, such as are typically used for decoupling purposes, having a capacitance of about 50 pf. Such low profile ceramic capacitors are commonly used with surface mounting applications. The recess 514 in the top surface 512 of the core 510 is made deep enough to fully receive the capacitors C1-C4 mounted on the wires 531-534. The capacitors C1-C4 can be covered with an insulating material, for example a resin or an epoxy. By making the core 510 of a high resistivity material, bare wires 531-534 can be used to facilitate the assembly of the filter 500.

As described herein, this invention provides for a compact noise filter which attenuates differential-mode or commonmode interference in a single component. In the embodiments shown, the filter of the present invention can be used to reduce EMI in signal transmission path in a wide scope of applications ranging from, for example, high-current, low-frequency power supplies to low-current, high frequency communication cables.

The simple construction of the filter according to the present invention also leads to considerable reduction in the cost of manufacture and assembly of electrical devices using the filter as disclosed herein. Although several embodiments have been described, the invention is not necessarily limited to the particular embodiments shown herein. It is to be understood that various other adaptations and modifications may be made within the spirit and scope of the invention.

What is claimed is:

1. A filter for attenuating electromagnetic noise in electronic circuits comprising:
   a magnetic core having a first portion and a second portion, a cavity formed in said first portion, a first and second throughhole formed in a said second portion, said first and second throughholes extending to said cavity;
   a first and second straight wire having terminal ends;
   means for connecting said terminal ends of said wires to the electronic circuits;
   said first wire fitted through said first throughhole and said cavity, said second wire fitted through said second throughhole and said cavity;
   said first and second wires in combination with said magnetic core providing an in-line inductor in series with a mutually coupled inductor for filtering differential-mode and common-mode noise in signal currents flowing through said first and second wires.

2. The filter as in claim 1 wherein said first portion of said core is made of a relatively high impedance magnetic material, and said second portion is made of a relatively low impedance magnetic material.

3. The filter as in claim 1 wherein said magnetic core is made of a pair of magnetic cores having different magnetic field absorption characteristics and said throughholes extend through said pair of magnetic cores.

4. The filter as in claim 1 wherein said magnetic core is plate shaped.

5. The filter as in claim 4 wherein said magnetic core is shaped to fit in a housing of RS232 connector.

6. A method for attenuating electromagnetic noise in electronic circuits comprising the steps of:
   fitting a first wire in a first throughhole of a first portion of a magnetic core and a cavity of a second portion of said magnetic core, said first throughhole extending to said cavity;
   fitting a second wire in a second throughhole of said first portion and said cavity of said second portion of said magnetic core, said second throughhole extending to said cavity, said second portion surrounding said cavity;
   connecting one end of said first wire to a first side of a signal source;
   connecting another end of said first wire to a first side of a signal receiver;
   connecting a first end of said second wire to a second side of a signal source;
   connecting a second end of said second wire to a second side of a signal receiver;
   said first and second wires in combination with said magnetic core providing an in-line inductor in series with a mutually coupled inductor for filtering differential-mode and common-mode noise in signal currents flowing through said wires.

* * * * *